United States Patent
Miyata et al.

(10) Patent No.: US 10,186,830 B2
(45) Date of Patent: Jan. 22, 2019

(54) LASER APPARATUS INCLUDING PLURALITY OF LASER MODULES

(71) Applicant: FANUC CORPORATION, Minamitsuru-gun, Yamanashi (JP)

(72) Inventors: Ryuusuke Miyata, Yamanashi (JP); Hiroshi Takigawa, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 15/940,350

(22) Filed: Mar. 29, 2018

(65) Prior Publication Data

US 2018/0294618 A1 Oct. 11, 2018

(30) Foreign Application Priority Data

Apr. 6, 2017 (JP) .................... 2017-075837

(51) Int. Cl.
| | |
|---|---|
| *H01S 3/131* | (2006.01) |
| *H01S 5/40* | (2006.01) |
| *H01S 3/13* | (2006.01) |
| *H01S 3/23* | (2006.01) |
| *H01S 5/0683* | (2006.01) |

(52) U.S. Cl.
CPC ............ *H01S 3/1305* (2013.01); *H01S 3/131* (2013.01); *H01S 3/2383* (2013.01); *H01S 5/0683* (2013.01); *H01S 5/4012* (2013.01); *H01S 5/4025* (2013.01)

(58) Field of Classification Search
CPC .... H01S 3/1305; H01S 5/0683; H01S 5/4025; H01S 5/4012; H01S 3/131; H01S 3/2383
See application file for complete search history.

(56) References Cited

U.S. PATENT DOCUMENTS

| | | | |
|---|---|---|---|
| 2006/0002270 A1* | 1/2006 | Shimizu | ............. B41J 2/45 369/59.1 |
| 2012/0269217 A1* | 10/2012 | Senda | ............. B23K 26/0613 372/38.02 |
| 2015/0375337 A1 | 12/2015 | Hayashi | |
| 2016/0367124 A1* | 12/2016 | Nishio | ............. H01S 5/068 |
| 2017/0279246 A1* | 9/2017 | Muendel | ............. H01S 5/0683 |

FOREIGN PATENT DOCUMENTS

| | | |
|---|---|---|
| JP | 2006-012888 A | 1/2006 |
| JP | 2012-227353 A | 11/2012 |
| WO | 2014-133013 A1 | 9/2014 |

* cited by examiner

*Primary Examiner* — Yuanda Zhang

(74) *Attorney, Agent, or Firm* — RatnerPrestia

(57) ABSTRACT

A laser apparatus including plural laser modules, and capable of preventing a defect occurring when a number of the modules to be driven is changed. The apparatus includes plural laser modules, an optical output command section for generating a first optical output command with respect to a combined laser beam from a combiner, and a laser module selection/command section for selecting a laser module to be driven and generating a second optical output command for each laser module. The laser module selection/command section outputs the second optical output command, in a period from when the number is changed to when a predetermined period of time elapses, to at least one of the laser modules that has been laser-oscillating before the number is changed, such that the combined laser beam having an output corresponding to the first optical output command is outputted only by the at least one laser module.

5 Claims, 8 Drawing Sheets

LASER APPARATUS INCLUDING PLURALITY OF LASER MODULES

CROSS-REFERENCE TO RELATED APPLICATION

This application is a new U.S. Patent Application that claims benefit of Japanese Patent Application No. 2017-075837, filed Apr. 6, 2017, the disclosure of this application is being incorporated herein by reference in its entirety foe all purposes.

BACKGROUND OF THE INVENTION

1. Field of the Invention

The present invention relates to a laser apparatus including a plurality of laser modules.

2. Description of the Related Art

An apparatus, that combines laser beams outputted from a plurality of laser modules (laser beam sources) and emits the obtained combined laser beam, is known in the related art (e.g., see JP 2006-012888 A).

Additionally, a technique is known, in a laser machining apparatus including a plurality of laser modules, in which the number of laser modules driven is adjusted on the basis of the output, a spot diameter, etc., of a combined laser beam (e.g., see JP 2012-227353 A and WO 2014/133013).

Individual laser modules have a lower limit with respect to the optical output at which the laser beam can be outputted stably, and thus changing of the number of laser-oscillating laser modules as appropriate is demanded in a laser apparatus including a plurality of laser modules, in order to ensure a broad optical output range. Here, in a case where the number of laser-oscillating laser modules is increased, the supply of power to at least one of the laser modules is started. However, there is a certain delay time to the start of the supply of power, and thus immediately after the number is changed, a phenomenon known as a "notch" occurs, in which the measured value of the combined laser beam drops greatly relative to a command value.

SUMMARY OF THE INVENTION

One aspect of the present disclosure is a laser apparatus including: a plurality of laser modules; a laser power source section configured to drive each of the plurality of laser modules; a combiner configured to combine laser beams emitted by the plurality of laser modules, and to output a combined laser beam; an optical output command section configured to generate a first optical output command with respect to the combined laser beam; a laser module selection/command section configured to select a laser module to be driven from the plurality of laser modules, based on the first optical output command, and to generate a second optical output command for each of the plurality of laser modules; and a control section configured to control the plurality of laser modules and the laser power source section, based on the second optical output command, wherein when changing the number of laser-oscillating laser modules in accordance with a change in the first optical output command, the laser module selection/command section outputs the second optical output command, in a period from when the number is changed to when a predetermined period of time elapses, to at least one of the plurality of laser modules that has been laser-oscillating before the number is changed, such that the combined laser beam having an output corresponding to the first optical output command is outputted only by the at least one of the plurality of laser modules that has been laser-oscillating before the number is changed.

BRIEF DESCRIPTION OF THE DRAWINGS

The objects, features and advantages of the invention will become more apparent from the following description of the embodiments in connection with the accompanying drawings, wherein.

DETAILED DESCRIPTION

Figure 1:
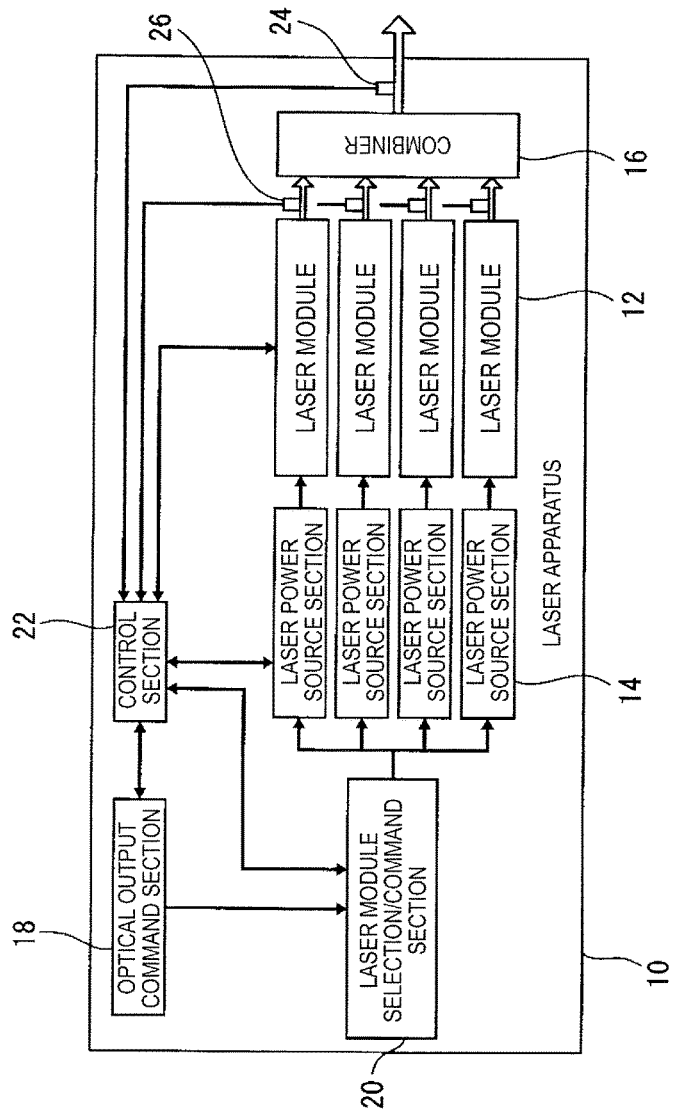
FIG. 1 is a functional block diagram illustrating main sections of a laser apparatus according to a preferred embodiment.

FIG. 1 is a functional block diagram illustrating main sections of a laser apparatus according to a preferred embodiment of the present invention. A laser apparatus 10 is, for example, a laser machining apparatus, and includes: a plurality of laser oscillation modules (laser modules) 12; laser power source sections (normally of the same number as the laser modules 12) that supply driving power to the laser modules 12; a combiner 16 that combines laser beams outputted from (emitted by) the laser modules 12 and that outputs a combined laser beam to the exterior; an optical output command section 18 that generates a first optical output command (value) for the combined laser beam; a laser module selection/command section 20 that selects laser module(s), among the plurality of laser modules 12, to be driven (laser oscillated) on the basis of the first optical output command, and that generates a second optical output command (value) for each of the selected laser module(s);

and a control section 22 that controls the laser power source sections 14 and the laser modules 12 on the basis of the second optical output command. Note that the number of the laser modules 12 is determined as appropriate in consideration of the purpose for which the laser apparatus 10 is used, and is a value in the range from 2 to 30, for example, but is not limited thereto.

The laser apparatus 10 also includes a first photodetector 24, such as a photosensor, that detects the actual intensity of the combined laser beam outputted from the combiner 16, and a second photodetector 26, such as a photosensor, that detects the intensity of the laser beam emitted by each of the laser modules 12. The detected values from these photosensors can be fed back into the control section 22, and thus the control section 22 can carry out feedback control based on the intensity of the combined laser beam and the intensities of the laser beams from the modules that have been detected.

The optical output command section 18, the laser module selection/command section 20, and the control section 22 can be provided as a processor, for example, and may be built into the laser apparatus 10 or a control device that controls the laser apparatus 10, or may be provided as a personal computer, etc., that is separate, in terms of appearance, from (the housing of) the laser apparatus 10. At least one of the optical output command section 18, the laser module selection/command section 20, and the control section 22 may include a function or a storage section such as a memory for storing data, etc., for carrying out arithmetic processing, as will be described later.

Figure 2:
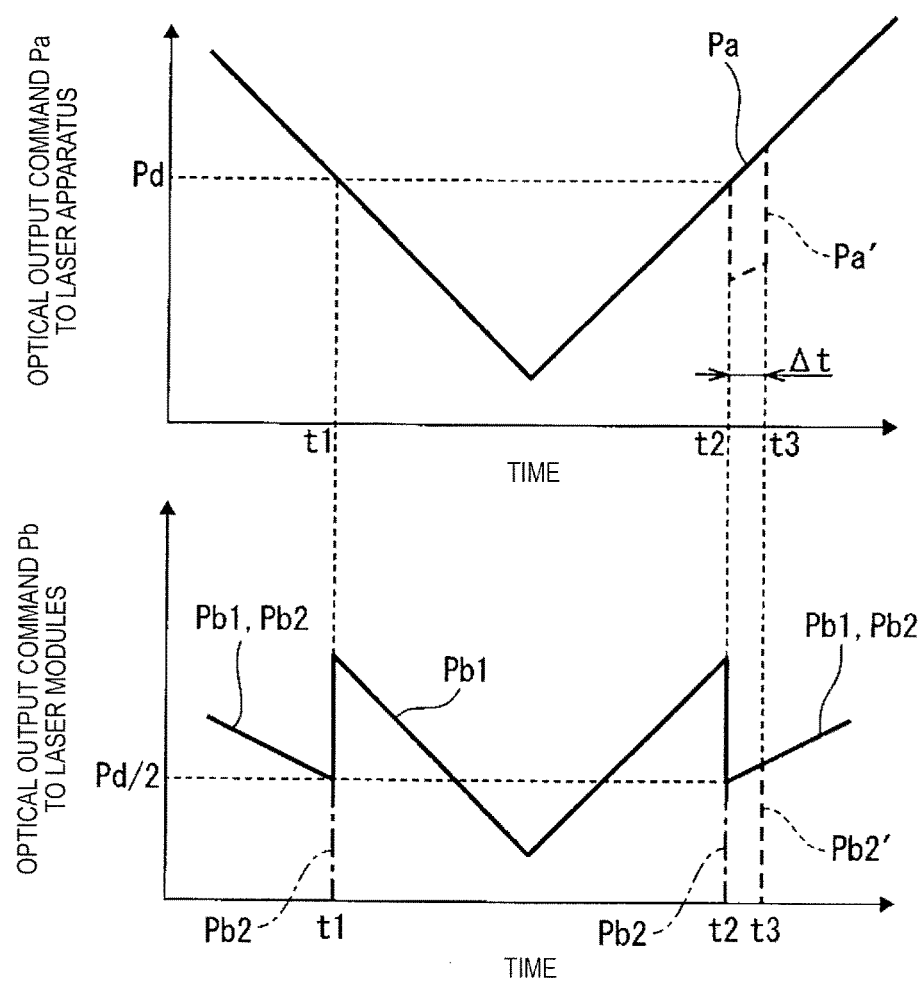
FIG. 2 is a graph illustrating an example of a temporal change in an optical output command according to a technique in the related art.

Processing carried out in the laser apparatus 10 for changing the laser modules to be driven will be described next. FIG. 2 is a graph illustrating, on the same time axis, an optical output command for a combined laser beam (Pa) and an optical output command for individual laser modules (Pb) in a laser apparatus according to a technique in the related art, for comparing with the present disclosure. A case where the laser apparatus includes two laser modules (laser modules 1 and 2) and changes the number of laser-oscillated (driven) modules from two to one (only one module being driven) and then changes to two will be described here. In FIG. 2, the second optical output command for the module 1 is indicated by Pb1, and the second optical output command for the module 2 is indicated by Pb2. The same applies in FIGS. 3 and 8, which will be described later.

When the optical output command Pa gradually decreases and reaches a predetermined threshold value Pd (time point t1), the driving of (power supply to) the laser module 2 is stopped, and only the laser module 1 is driven until the time at which the optical output command Pa reaches the threshold value Pd again (time point t2). The supply of power to the laser module 2 is started at time point t2, but there is a certain delay time (Δt) at the start of the power supply, and thus an actual optical output Pb2' of the laser module 2 is substantially zero during the period from time point t2 to when the delay time elapses (from t2 to t3). Hence, the actual optical output of the combined laser beam (Pa') is much lower than the optical output command Pa from time point t2 to time point t3, resulting in a phenomenon known as a "notch". Such a notch destabilizes the laser output, and thus in a case where the laser apparatus is used as a laser machining apparatus, for example, a line-shaped pattern may be formed on the processed surface (cut surface), or an uncut part may remain.

Figure 3:
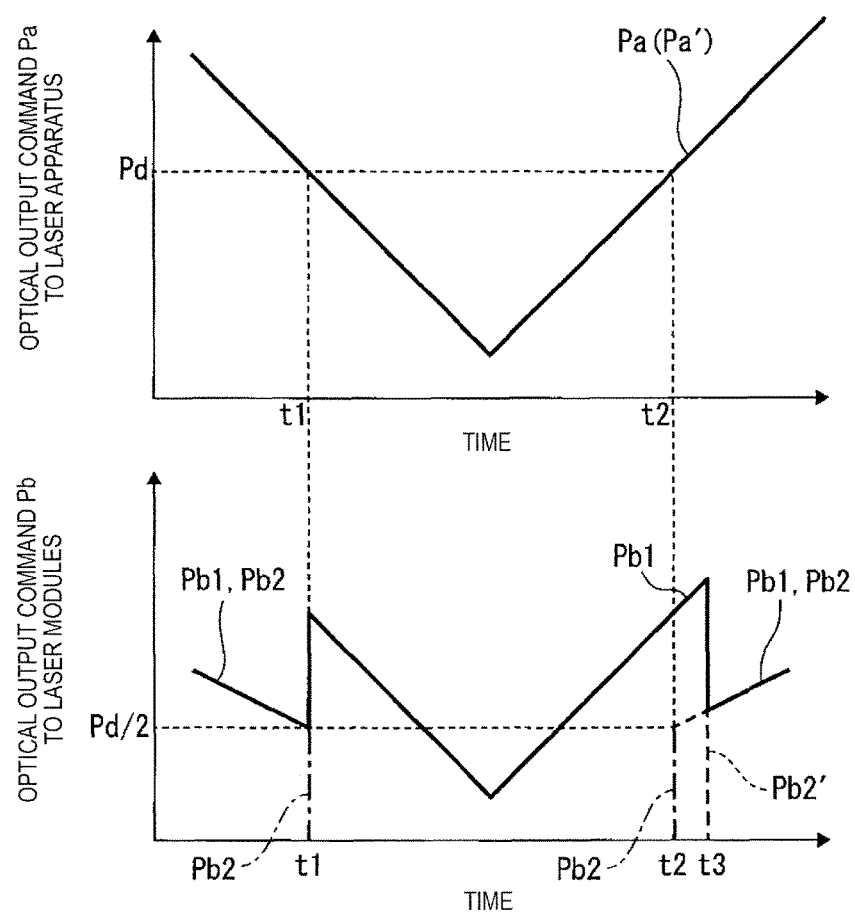
FIG. 3 is a graph illustrating an example of a temporal change in an optical output command in the laser apparatus of FIG. 1.

FIG. 3 is a graph illustrating, on the same time axis, an optical output command for a combined laser beam (Pa) and an optical output command for individual laser modules (Pb) in the laser apparatus 10 according to the present disclosure, for comparison with FIG. 2. When the number of laser-oscillating laser modules is to be increased (time point t2), the laser module selection/command section 20 outputs, during a period from when the number is changed (more specifically, when a command to start the supply of power to the module 2 is outputted) to when a predetermined period of time elapses (time point t3), the second optical output command Pb1 to the laser module 1 so that the combined laser beam has an output in accordance with the first optical output command by using only the laser module 1, which has been laser-oscillating before the number is changed.

To be more specific, from time point t2 to when a predetermined period of time substantially identical to the above-described delay time Δt elapses (from t2 to t3), the same second optical output command (value) Pb2 as in the technique in the related art (in the example illustrated, a command to start oscillating at an output of Pd/2 starting from an oscillation stopped state at time point t2) is sent to the laser power source section 14 of the laser module 2 that starts laser-oscillating after the number is changed. However, from t2 to t3, with respect to the laser module 1 that has been laser-oscillating before the number is changed, the second optical output command (value) Pb1 is sent to the laser power source section 14 of the laser module 1 so that the combiner 16 outputs a combined laser beam having an output corresponding to the first optical output command (value) by using only the output of the laser module 1. In other words, in the case of FIG. 3, the second optical output command value Pb1 for the laser module 1 is identical to the first optical output command value Pa from time point t1 to time point t3. Furthermore, the same second optical output command (value) Pb1 as in the technique in the related art (a command to output the combined laser beam at an output corresponding to the first optical output command (value) using both the laser modules 1 and 2) is sent to the laser power source section 14 of the laser module 1 as well from time point t3, after the predetermined period of time elapses.

Through the above-described processing, with the laser apparatus 10, even when the actual optical output Pb2' of the laser module 2 is delayed by a period of time identical to the delay time from when the second optical output command Pb2 is received, the laser module 1 laser-oscillates at an output that compensates for the delay. Thus, as indicated in the upper graph in FIG. 3, the optical output command Pa and the actual optical output Pa' substantially match, and the notch as indicated in FIG. 2 does not occur. Accordingly, the output of the combined laser beam is stable in the laser apparatus 10, and in a case where the laser apparatus 10 is used as a laser machining apparatus, for example, a drop in machining precision, machining failure occurrence, etc., caused by the notch can be eliminated or reduced.

Note that the period from time point t2 to time point t3 (the delay time) is exaggerated in FIGS. 2 and 3 for the sake of clarity. Although depending on the specifications, etc., of the laser modules, the actual delay time Δt is in a range from approximately 5 μs to 300 μs, and is normally a known value. The occurrence of the notch can thus be prevented by setting the above-described predetermined period of time to be a value equal to or greater than the delay time (e.g., from 100% to 150% of the delay time). However, the delay time may be different from laser module to laser module, and thus an operator may be able to set or change the above-described predetermined period of time as a parameter, etc., by using a suitable input measure (a touch panel, a keyboard, etc., provided in the laser apparatus).

Even in an identical laser module, the startup may be faster (the delay time may be shorter), in a case where a period from when the supply of power is stopped to when power is supplied again is relatively short, as compared to a case where such a period is long.

Accordingly, a timer that measures the period from when the supply of power is stopped to when power is supplied again can be provided in each module, and the above-described predetermined period of time can be automatically adjusted on the basis of the measurement taken by the timer. Alternatively, rather than a timer, a temperature sensor for measuring the temperature of a component correlated with the period from when the supply of power is stopped to when power is supplied again (e.g., a switching part of the laser power source section 14) may be provided, and the above-described predetermined period of time can be automatically adjusted on the basis of the measurement taken by the temperature sensor.

With the laser apparatus 10 according to the present disclosure as described above, the occurrence of a notch when the number of oscillating laser modules is changed (increased, in the above example) can be greatly reduced. However, in reality, in a case where there is a comparatively large change in the optical output command value to the laser modules between before and after the number of laser-oscillating laser modules is changed, a notch may, depending on factors such as the characteristics of the laser power source sections and so on, occur in the optical output of the laser modules. Thus, it is desirable that a change amount in the optical output command value to the laser module be small between before and after the number is changed. Additionally, even in the case where the change amount in the optical output command values to the laser modules is small, in some situations, a small notch may occur when the number is changed. Thus, it is preferable that the number not be changed frequently.

Accordingly, examples for reducing the size or the frequency of the notch that can occur when changing the number of oscillating laser modules will be described with reference to FIGS. 4 to 7. The following examples assume that the laser apparatus 10 includes sixteen laser modules 12 and that the output range of each module is from 50 W to 500 W. In this case, the rated output of the laser apparatus 10 (the maximum output possible range) is 8000 W.

First, as a process for reducing the size of the notch, in a case where the number of laser-oscillating laser modules 12 is changed in accordance with a change in the first optical output command value, the laser module selection/command section 20 can determine a threshold value of the first optical output command value, which serves as a reference for a changeover, and can determine the number of laser modules before and after the changing (or the number of laser modules before the changeover and the number of the increase or decrease) so that a change amount $\Delta Pi$ in the second optical output command value to each module between before and after the changeover is less than or equal to a predetermined upper limit value. The occurrence of a large notch can be prevented by limiting the change amount in the second optical output command value to less than or equal to the predetermined upper limit value. The "predetermined upper limit value" mentioned here can be determined experimentally on the basis of past performance, for example.

The size of the notch tends to be smaller as the change amount $\Delta Pi$ in the second optical output command value is lower, and thus when focusing only on $\Delta Pi$, it is desirable that the number of oscillating laser modules be changed as frequently as possible. However, as described above, a notch can also occur due to changing of the number itself. Therefore, the laser module selection/command section 20 can determine $\Delta Pi$, a number N of oscillating laser modules before the changeover, and a change amount $\Delta N$ in the number at the time of the changeover (or the number of oscillating laser modules after the changeover) so that the frequency of changing the number is minimum while keeping $\Delta Pi$ at less than or equal to the predetermined upper limit value.

Figure 4:
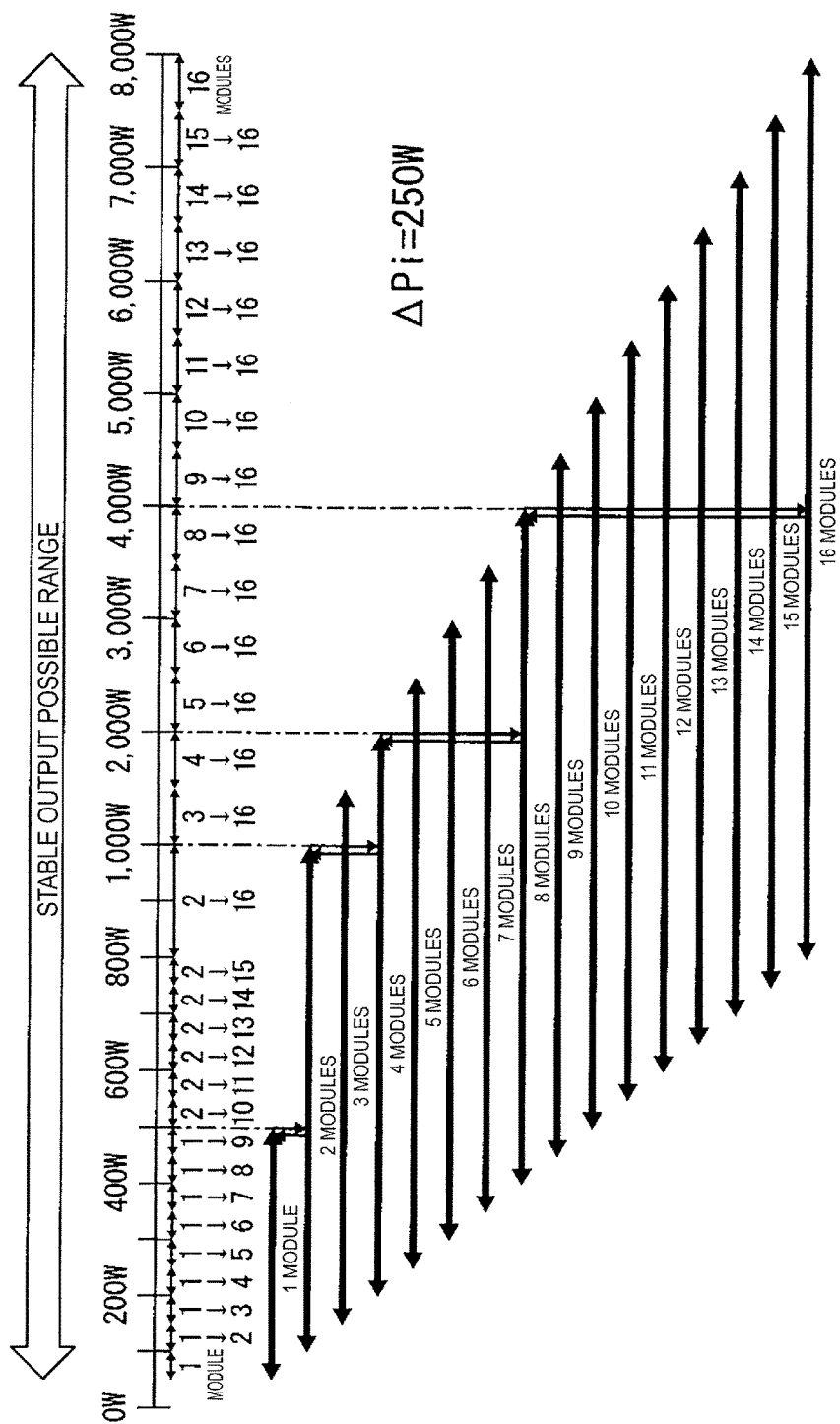
FIG. 4 is a diagram illustrating a correspondence relationship between an output of the laser apparatus and a number of oscillating laser modules, along with an example in which there are four threshold values for changing the number within an output possible range of the laser apparatus.

For example, in a case where the upper limit value of $\Delta Pi$ is set to 250 W, the number of changeover times in a case where the first optical output command value changes from a maximum optical output command value (8000 W, here) to a minimum optical output command value (50 W, here) (or the reverse) in an output possible range of the laser apparatus 10 can be set to four (i.e., four threshold values within the output possible range), as illustrated in FIG. 4. Specifically, the relationships of Pd, N, $\Delta N$, and $\Delta Pi$ are as indicated in Table 1 below. By minimizing the frequency of changing the number of oscillating laser modules while keeping $\Delta Pi$ less than or equal to the predetermined upper limit value in this manner, both the size and the frequency of the notch can be minimized favorably.

TABLE 1

| Pd | N | $\Delta N$ | $\Delta Pi$ |
|---|---|---|---|
| 500 W | 1 (2) | 1 | 250 W (=500 W/1-500 W/2) |
| 1000 W | 2 (4) | 2 | 250 W (=1000 W/2-1000 W/4) |
| 2000 W | 4 (8) | 4 | 250 W (=2000 W/4-2000 W/8) |
| 4000 W | 8 (16) | 8 | 250 W (=4000 W/8-4000 W/16) |

FIG. 4 indicates the output possible range of the laser apparatus as a whole (from 50 W to 8000 W), as well as an output possible range in accordance with the number of oscillating laser modules (e.g., from 100 W to 1000 W for two laser modules). Furthermore, denotations such as "3->16" indicate the number of laser modules that can be used in such an output range. For example, "3->16" is indicated for from 1000 W to 1500 W, and thus three to sixteen modules can be used in the range. For the above indications, the same applies in FIGS. 5 to 7, as will be described later.

Figure 5:
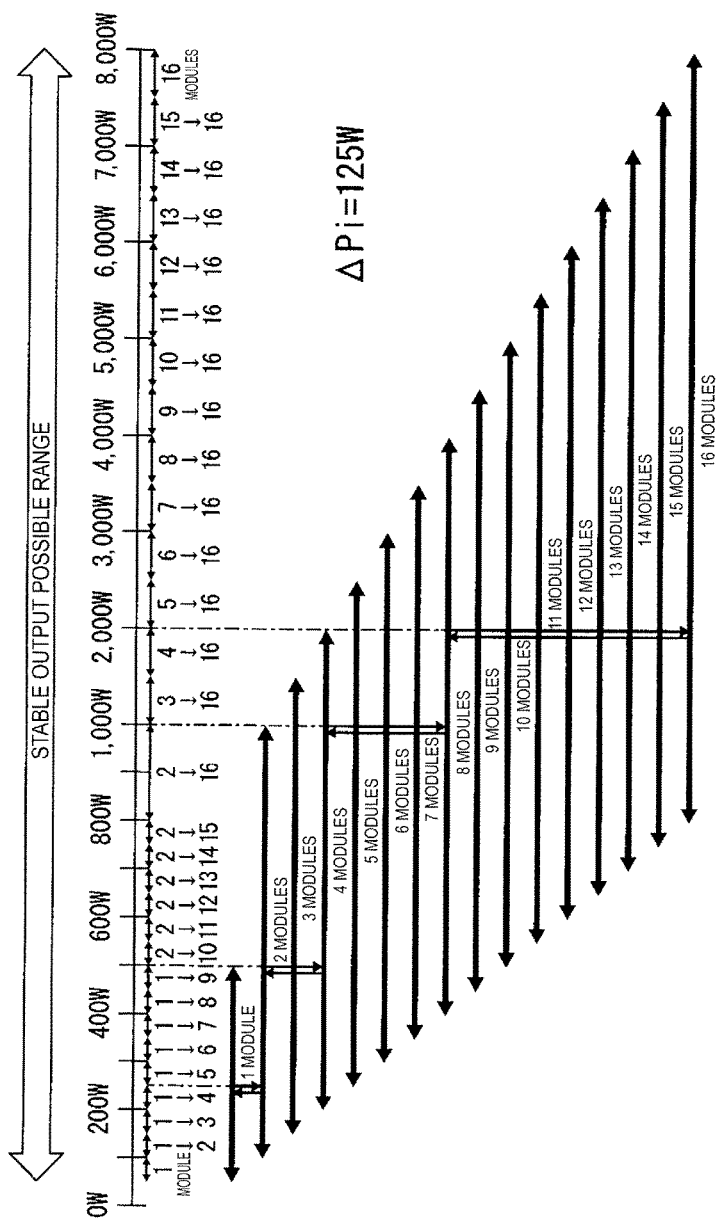
FIG. 5 is a diagram illustrating a correspondence relationship between an output of the laser apparatus and the number of oscillating laser modules, along with another example in which there are four threshold values for changing the number within the output possible range of the laser apparatus.

The example of FIG. 4 can be optimized further. For example, as illustrated in FIG. 5, the upper limit value of $\Delta Pi$ can be reduced further while keeping the changeover frequency at four, and the relationships of Pd, N, $\Delta N$, and $\Delta Pi$, corresponding to the example illustrated in FIG. 5, become as indicated in Table 2 below. In this case, $\Delta Pi$ can be reduced to 125 W while keeping the changeover frequency at four (four threshold values).

TABLE 2

| Pd | N | $\Delta N$ | $\Delta Pi$ |
|---|---|---|---|
| 250 W | 1 (2) | 1 | 125 W (=250 W/1-250 W/2) |
| 500 W | 2 (4) | 2 | 125 W (=500 W/2-500 W/4) |
| 1000 W | 4 (8) | 4 | 125 W (=1000 W/4-1000 W/8) |
| 2000 W | 8 (16) | 8 | 125 W (=2000 W/8-2000 W/16) |

In the examples illustrated in FIGS. 4 and 5, the changeover frequency is minimized after setting the upper limit value of $\Delta Pi$ first. However, the changeover frequency can be minimized first. In other words, in a case where the first optical output command value is changed from the maximum optical output command value (8000 W, here) to the minimum optical output command value (50 W, here) of the laser apparatus (or the reverse), the laser module selection/ command section 20 can determine Pd, N, and ΔN, so that the changeover frequency in changing the number of laser-oscillating laser modules (i.e., the number of threshold values within the output possible range) is the lowest. For example, in a case where the relationships of Pd, N, ΔN, and ΔPi are set as indicated below in Table 3, the number of changeover times becomes two (two threshold values).

TABLE 3

| Pd | N | ΔN | ΔPi |
|---|---|---|---|
| 500 W | 1 (10) | 9 | 450 W (=500 W/1-500 W/10) |
| 5000 W | 10 (16) | 6 | 187.5 W (=5000 W/10-5000 W/16) |

Figure 6:
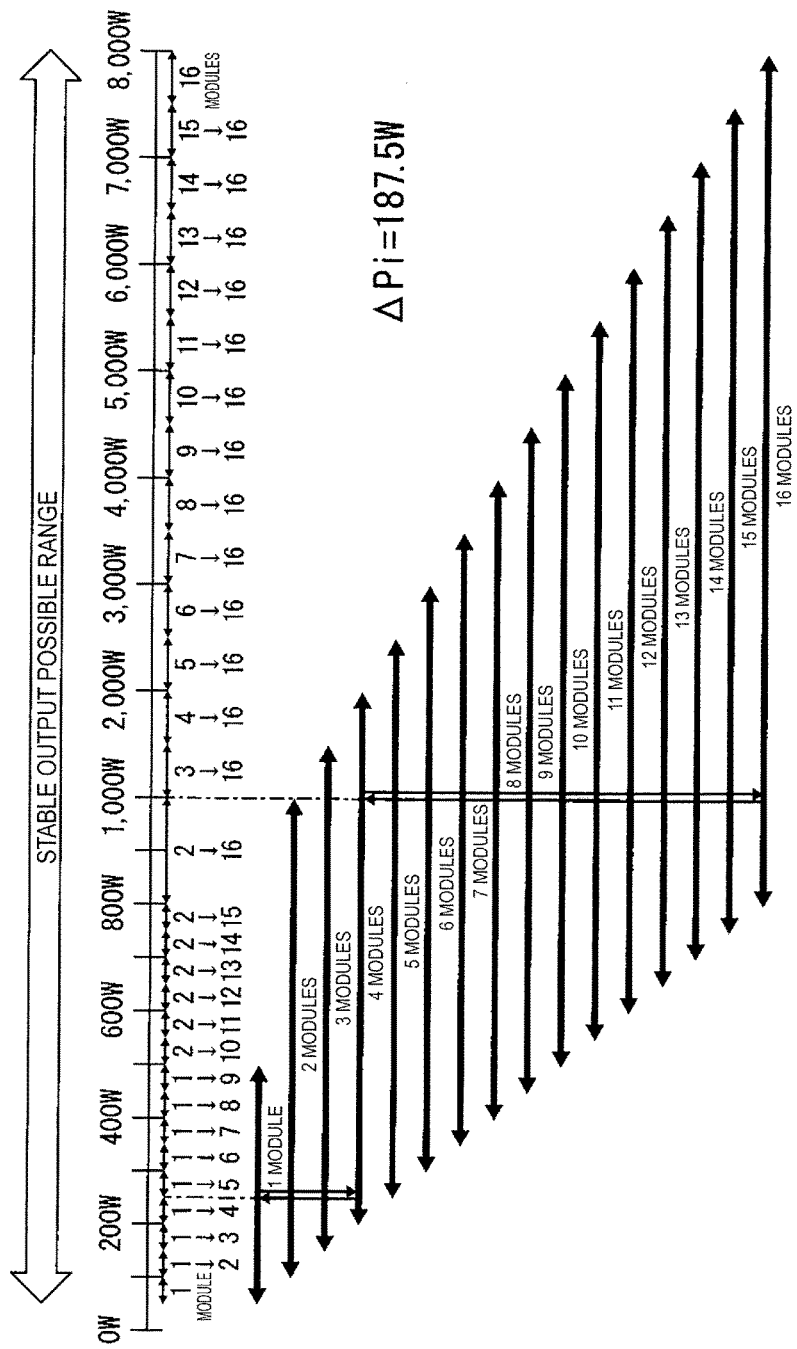
FIG. 6 is a diagram illustrating a correspondence relationship between an output of the laser apparatus and the number of oscillating laser modules, along with an example in which there are two threshold values for changing the number within the output possible range of the laser apparatus.

As indicated in Table 3, ΔPi is a comparatively high 450 W at the time of a changeover with a threshold value Pd of 500 W, and thus a comparatively large notch might occur in this case. Accordingly, in the example indicated by Table 3, ΔPi can be reduced while maintaining the number of changeover times (the number of threshold values) by setting the upper limit value of ΔPi. FIG. 6 illustrates an example in a case where the upper limit value of ΔPi is set to 200 W, and the relationships of Pd, N, ΔN, and ΔPi become as indicated in Table 4 below.

TABLE 4

| Pd | N | ΔN | ΔPi |
|---|---|---|---|
| 250 W | 1 (4) | 3 | 187.5 W (=250 W/1-250 W/4) |
| 1000 W | 4 (16) | 12 | 187.5 W (=1000 W/4-1000 W/16) |

Figure 7:
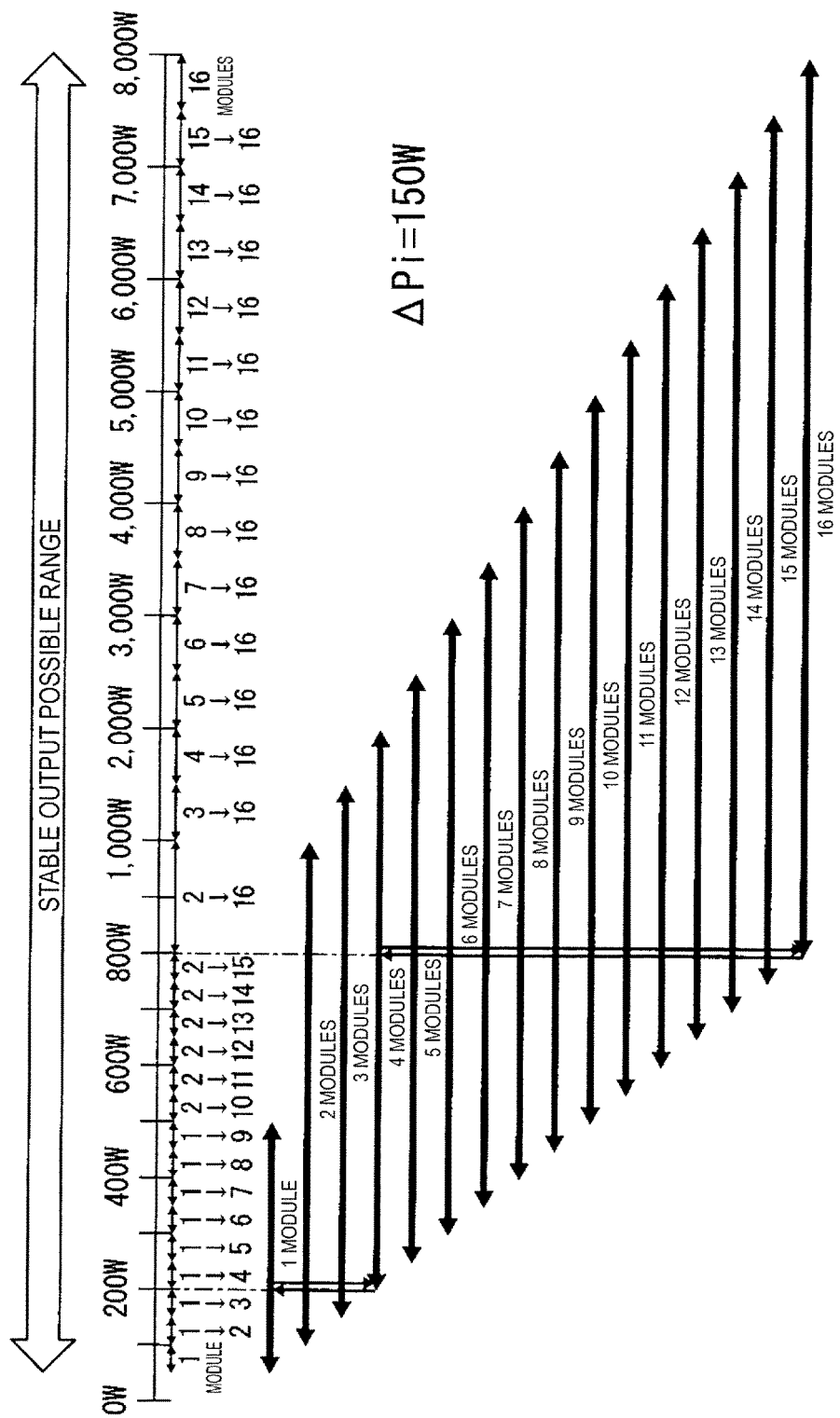
FIG. 7 is a diagram illustrating a correspondence relationship between an output of the laser apparatus and the number of oscillating laser modules, along with another example in which there are two threshold values for changing the number within the output possible range of the laser apparatus.

The example of FIG. 6 can be optimized further. For example, as illustrated in FIG. 7, conditions under which ΔPi is minimized while keeping the changeover frequency at two can be found, and the relationships of Pd, N, ΔN, and ΔPi, corresponding to the example illustrated in FIG. 7, become as indicated in Table 5 below. In this case, ΔPi can be reduced to 150 W while keeping the number of threshold values within the output possible range at two.

TABLE 5

| Pd | N | ΔN | ΔPi |
|---|---|---|---|
| 200 W | 1 (4) | 3 | 150 W (=200 W/1-200 W/4) |
| 800 W | 4 (16) | 12 | 150 W (=800 W/4-800 W/16) |

Although the above examples describe processing that uses the change amount ΔPi in the second optical output command value for the modules before and after the changeover, a change amount ΔEi in the power supplied to the modules may be used instead of ΔPi. ΔPi and ΔEi are generally in a proportional relationship, and thus similar effects as those of the above-described examples can be achieved in a case where ΔEi is used as well.

Additionally, in the above-described examples, the relationships of Pd, N, ΔN, and ΔPi found by the laser module selection/command section 20 can be stored in advance in a predetermined program, memory, etc. Additionally, an operator may be able to manually set or change at least one of Pd, N, ΔN, and ΔPi by using a suitable input measure such as a touch panel or keyboard provided in the laser apparatus. In this case, the laser module selection/command section 20 can recalculate the relationships of Pd, N, ΔN, and ΔPi on the basis of the details that have been set or changed.

Figure 8:
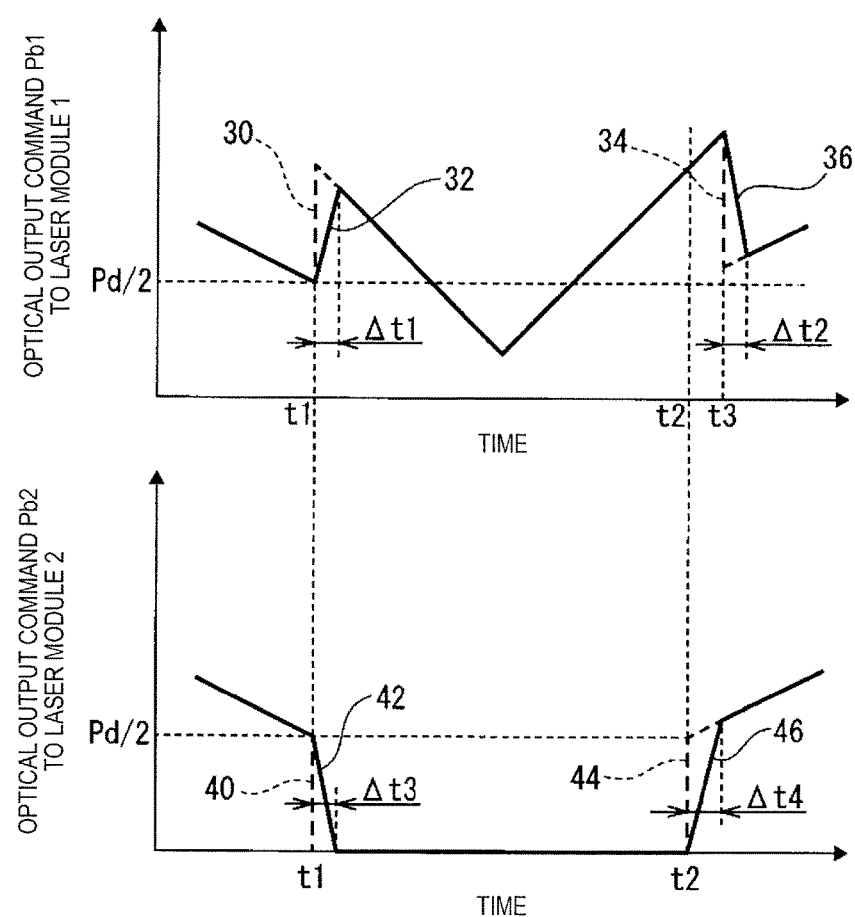
FIG. 8 is a graph illustrating an example of changes over time in an optical output command in the laser apparatus of FIG. 1, along with a case where a second optical output command is gradually changed.

FIG. 8 is a diagram illustrating another example of reducing the occurrence or the magnitude of a notch. When changing the number of laser-oscillating laser modules, the laser module selection/command section 20 can change the second optical output command value for at least one of the laser modules (the modules 1 and 2, here) for which the second optical output command value is to be changed, along a gradient (gradually over a predetermined period of time) rather than a stepwise manner (or non-continuously) over time.

Specifically, in the example illustrated in FIG. 3, the second optical output command value Pb1 is changed to double for the laser module 1 at time point t1 (indicated by a dotted line 30 in FIG. 8). However, the second optical output command value can be gradually increased over a predetermined period of time Δt1, as indicated by a solid line 32. In a case where the second optical output command value Pb1 is changed as indicated by the dotted line 30, the actual optical output of the module 1 will become larger than the command value due to an overshoot, and a notch will occur as a result. However, the gradient as indicated by the solid line 32 prevents such an overshoot and reduces the occurrence of a notch. Additionally, in the example illustrated in FIG. 3, the second optical output command value Pb1 is changed to ½ for the laser module 1 at time point t3 (indicated by a dotted line 34 in FIG. 8). However, the second optical output command value Pb1 can be gradually reduced over a predetermined period of time Δt2, as indicated by a solid line 36. Although differing depending on the specifications of the laser module, etc., the predetermined periods of time Δt1 and Δt2 can be set to values in a range of from approximately 5 μs to 50 μs.

Likewise, in the example illustrated in FIG. 3, the supply of power to the laser module 2 is stopped at time point t1 (indicated by a dotted line 40 in FIG. 8). However, the second optical output command value Pb2 can be gradually reduced over a predetermined period of time Δt3, as indicated by a solid line 42. Additionally, in the example illustrated in FIG. 3, the supply of power to the laser module 2 is restarted at time point t2 (indicated by a dotted line 44 in FIG. 8). However, the second optical output command value Pb2 can be gradually increased over a predetermined period of time Δt4, as indicated by a solid line 46. Accordingly, the occurrence of a notch due to an overshoot, etc., can be reduced or eliminated in this case as well. Although differing depending on the specifications of the laser module, etc., the predetermined periods of time Δt3 and Δt4, too, can be set to values in a range of from approximately 5 μs to 50 μs. Furthermore, the predetermined periods of time Δt1 to Δt4 may be the same or may be different.

According to the present disclosure, in a laser apparatus including a plurality of laser modules, the occurrence of a notch in changing the number of laser-oscillating laser modules can be prevented, and the stability of laser output can be improved.

While the invention has been described with reference to specific embodiments chosen for the purpose of illustration, it should be apparent that numerous modifications could be made thereto, by one skilled in the art, without departing from the basic concept and scope of the invention.

The invention claimed is:
1. A laser apparatus comprising:
   a plurality of laser modules;
   a laser power source section configured to drive each of the plurality of laser modules;

a combiner configured to combine laser beams emitted by the plurality of laser modules, and to output a combined laser beam;

an optical output command section configured to generate a first optical output command with respect to the combined laser beam;

a laser module selection/command section configured to select a laser module to be driven from the plurality of laser modules, based on the first optical output command, and to generate a second optical output command for each of the plurality of laser modules; and a control section configured to control the plurality of laser modules and the laser power source section, based on the second optical output command, wherein, when changing the number of laser-oscillating laser modules in accordance with a change in the first optical output command, the laser module selection/command section outputs the second optical output command, in a period from when the number is changed to when a predetermined period of time elapses, to at least one of the plurality of laser modules that has been laser-oscillating before the number is changed, such that the combined laser beam having an output corresponding to the first optical output command is outputted only by the at least one of the plurality of laser modules that has been laser-oscillating before the number is changed.

2. The laser apparatus of claim 1,
wherein, when changing the number of laser-oscillating laser modules in accordance with the change in the first optical output command, the laser module selection/command section determines a threshold value of the first optical output command, the threshold value serving as a reference for changing the number of laser-oscillating laser modules, and determines the number of laser modules before and after changing the number, such that either a change amount in the second optical output command to the plurality of laser modules or a change amount in the power supplied to the plurality of laser modules, in accordance with changing the number, is equal to or smaller than a predetermined upper limit value.

3. The laser apparatus of claim 1,
wherein, when changing the number of laser-oscillating laser modules in accordance with the change in the first optical output command, the laser module selection/command section determines a threshold value of the first optical output command, the threshold value serving as a reference for changing the number of laser-oscillating laser modules within an output possible range of the laser apparatus, and determines the number of laser modules before and after changing the number, such that the number of the threshold values is minimum within the output possible range of the laser apparatus.

4. The laser apparatus of claim 3,
wherein the laser module selection/command section determines a threshold value of the first optical output command, the threshold value serving as a reference for changing the number of laser-oscillating laser modules, and determines the number of laser modules before and after the changing the number, such that either a change amount in the second optical output command to the laser modules or a change amount in the power supplied to the plurality of laser modules, in accordance with changing the number of laser-oscillating laser modules, is minimum or is equal to or smaller than a predetermined upper limit value.

5. The laser apparatus of claim 1,
wherein, when changing the number of laser-oscillating laser modules in accordance with the change in the first optical output command, the laser module selection/command section changes the second optical output command value to at least one of the plurality of laser modules along a gradient over time.

* * * * *